(12) United States Patent
Deutsch et al.

(10) Patent No.: US 11,353,715 B2
(45) Date of Patent: Jun. 7, 2022

(54) WAVELENGTH BEAM COMBINING LASER SYSTEMS UTILIZING LENS ROLL FOR CHIEF RAY FOCUSING

(71) Applicants: Michael Deutsch, Wilmington, MA (US); Daqing Wang, Wilmington, MA (US); James Zambuto, Winchester, MA (US); Bien Chann, Merrimack, NH (US); Bryan Lochman, Somerville, MA (US)

(72) Inventors: Michael Deutsch, Wilmington, MA (US); Daqing Wang, Wilmington, MA (US); James Zambuto, Winchester, MA (US); Bien Chann, Merrimack, NH (US); Bryan Lochman, Somerville, MA (US)

(73) Assignee: TERADIODE, INC., Wilmington, MA (US)

( * ) Notice: Subject to any disclaimer, the term of this patent is extended or adjusted under 35 U.S.C. 154(b) by 170 days.

(21) Appl. No.: 16/815,141

(22) Filed: Mar. 11, 2020

(65) Prior Publication Data
US 2020/0333613 A1  Oct. 22, 2020

Related U.S. Application Data

(63) Continuation of application No. 16/275,539, filed on Feb. 14, 2019, now Pat. No. 10,627,639, which is a
(Continued)

(51) Int. Cl.
*G02B 5/18*  (2006.01)
*G02B 27/44*  (2006.01)
(Continued)

(52) U.S. Cl.
CPC ....... *G02B 27/108* (2013.01); *G02B 27/0944* (2013.01); *G02B 27/1006* (2013.01);
(Continued)

(58) Field of Classification Search
CPC .. G02B 26/02; G02B 27/108; G02B 27/1006; G02B 27/1086; G02B 27/0944;
(Continued)

(56) References Cited

U.S. PATENT DOCUMENTS 9,746,679 B2   8/2017 Deutsch et al.
10,241,338 B2   3/2019 Deutsch et al.
(Continued)

FOREIGN PATENT DOCUMENTS

WO      2014087726 A1    6/2014

OTHER PUBLICATIONS

International Search Report and Written Opinion issued in a corresponding International Application No. PCT/US2015/03467 4 dated Oct. 8, 2015.

*Primary Examiner* — Mahidere S Sahle
(74) *Attorney, Agent, or Firm* — Morgan, Lewis & Bockius LLP

(57) ABSTRACT

In various embodiments, a wavelength beam combining laser system includes a fast-axis collimation lens that is rotated with respect to a plurality of emitters in order to converge the emitted beams onto a dispersive element and/or reduce the size of the multi-wavelength output beam of the system.

21 Claims, 14 Drawing Sheets

Related U.S. Application Data continuation of application No. 15/658,959, filed on Jul. 25, 2017, now Pat. No. 10,241,338, which is a continuation of application No. 14/733,275, filed on Jun. 8, 2015, now Pat. No. 9,746,679, which is a continuation-in-part of application No. 13/686,974, filed on Nov. 28, 2012, now Pat. No. 9,104,029.

(60) Provisional application No. 62/012,335, filed on Jun. 14, 2014, provisional application No. 61/601,763, filed on Feb. 22, 2012.

(51) Int. Cl.
| | | |
|---|---|---|
| *G02B 27/10* | (2006.01) | |
| *G02B 27/09* | (2006.01) | |
| *H01S 3/23* | (2006.01) | |
| *H01S 5/40* | (2006.01) | |
| *G02B 26/02* | (2006.01) | |
| *H01S 5/14* | (2006.01) | |
| *H01S 5/02251* | (2021.01) | |

(52) U.S. Cl.
CPC ........ *G02B 27/1086* (2013.01); *H01S 3/2391* (2013.01); *H01S 5/4062* (2013.01); *G02B 26/02* (2013.01); *H01S 5/02251* (2021.01); *H01S 5/143* (2013.01); *H01S 5/4087* (2013.01); *Y10T 29/49895* (2015.01)

(58) Field of Classification Search
CPC .. H01S 3/2391; H01S 5/4062; H01S 5/02251; H01S 5/143; H01S 5/4087; Y10T 29/49895
USPC ........................................ 359/566, 634, 639
See application file for complete search history.

(56) References Cited

U.S. PATENT DOCUMENTS

| | | |
|---|---|---|
| 2007/0064754 A1 | 3/2007 | Zheng et al. |
| 2010/0110556 A1* | 5/2010 | Chann .................. H01S 5/4062 359/619 |
| 2011/0216792 A1 | 9/2011 | Chann et al. |
| 2011/0222574 A1* | 9/2011 | Chann ................ G02B 27/0966 372/100 |
| 2012/0105968 A1 | 5/2012 | Chann et al. |
| 2013/0215517 A1 | 8/2013 | Tayebati et al. |
| 2016/0048028 A1 | 2/2016 | Deutsch et al. |
| 2017/0329147 A1 | 11/2017 | Deutsch et al. |
| 2019/0250417 A1 | 8/2019 | Deutsch et al. |

* cited by examiner

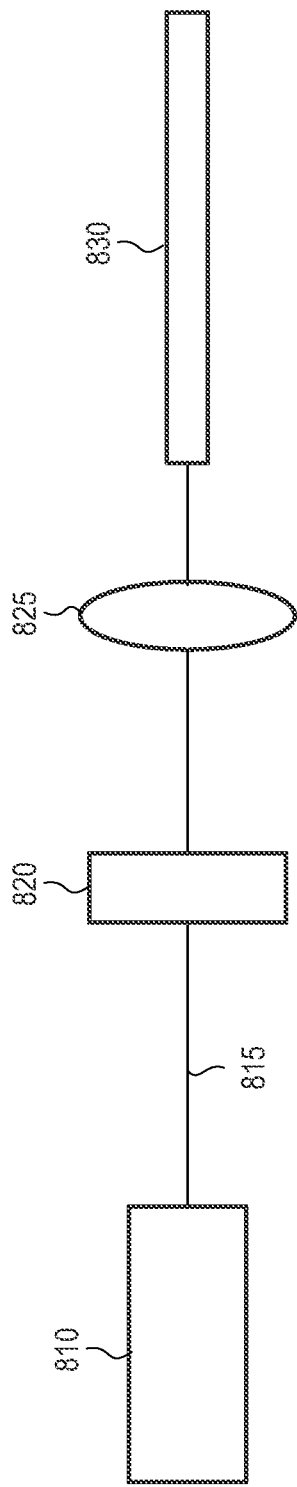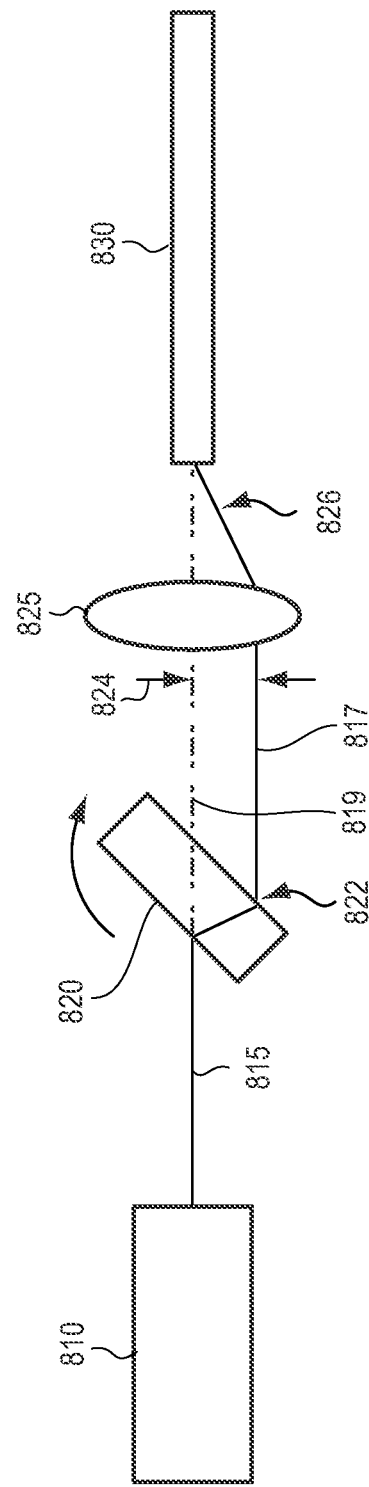

WAVELENGTH BEAM COMBINING LASER SYSTEMS UTILIZING LENS ROLL FOR CHIEF RAY FOCUSING

RELATED APPLICATIONS

This application is a continuation of U.S. patent application Ser. No. 16/275,539, filed Feb. 14, 2019, which is a continuation of U.S. patent application Ser. No. 15/658,959, filed Jul. 25, 2017, which is a continuation of U.S. patent application Ser. No. 14/733,275, filed Jun. 8, 2015, which claims the benefit of and priority to U.S. Provisional Patent Application No. 62/012,335, filed Jun. 14, 2014, the entire disclosure of each of which is hereby incorporated herein by reference. U.S. patent application Ser. No. 14/733,275, filed Jun. 8, 2015, is also a continuation-in-part of U.S. patent application Ser. No. 13/686,974, filed Nov. 28, 2012, which claims the benefit of and priority to U.S. Provisional Patent Application No. 61/601,763, filed Feb. 22, 2012. The entire disclosure of each of these references is hereby incorporated herein by reference.

TECHNICAL FIELD

In various embodiments, the present invention relates to laser systems, specifically wavelength beam combining laser systems with adjustable optics that overlap individual emitter beams to form a combined beam.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. The optical system is typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

Wavelength beam combining (WBC) is a technique for scaling the output power and brightness from laser diode bars, stacks of diode bars, or other lasers arranged in one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

While a variety of WBC techniques have been utilized to form high-power lasers for a host of different applications, many such techniques involve complicated arrangements of optical elements for beam manipulation, and, depending on the locations of the various optical elements in the optical train of the system, it may be difficult to obtain the desired beam quality factor of the final combined beam and/or to maintain a relatively small overall footprint of the laser system. Thus, there is a need for improved WBC systems and techniques of combining the outputs of different laser emitters into an output beam having a high beam quality factor (i.e., a beam quality factor as close to unity as possible) and that result in relatively compact laser systems.

SUMMARY

In accordance with embodiments of the present invention, wavelength beam combining laser systems feature multiple emitters (or "beam emitters"), e.g., diode bars or the individual diode emitters of a diode bar, which are combined using a dispersive element to form a multi-wavelength beam. Each emitter in the system individually resonates and is stabilized through wavelength-specific feedback from a common partially reflecting output coupler that is filtered by the dispersive element (e.g., a diffraction grating, a dispersive prism, a grism (prism/grating), a transmission grating, or an Echelle grating) along the beam-combining dimension. In this manner, laser systems in accordance with embodiments of the present invention produce multi-wavelength output beams having high brightness and high power.

In accordance with various embodiments of the present invention, the laser system features a one-dimensional or two-dimensional array of beam emitters, as well as a fast-axis collimation (FAC) lens and a beam rotator (or "optical rotator," or "beam twister," "optical rotation system," or "optical twister") downstream of the FAC lens. (Herein, "downstream" or "optically downstream," is utilized to indicate the relative placement of a second element that a light beam strikes after encountering a first element, the first element being "upstream," or "optically upstream" of the second element.) The FAC lens (itself only or along with the beam rotator) is rotated relative to the array dimension of the beam emitters in order to attain chief ray focus of the beams emitted by the beam emitters and, thus, to overlap the individual beams at the dispersive element of the WBC system and minimize beam-quality degradation in the fast diverging axis (or "fast axis," each beam typically having a fast diverging axis and a slow diverging axis). Achievement of chief ray focus of the beam emitters at an optical distance substantially equal to the optical distance between the beam emitters and the dispersive element results in beam quality in the fast axis to be substantially equal to the beam quality of any one of the beam emitters. (Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other.)

Like the focusing optics (i.e., one or more lenses) in conventional WBC laser systems, embodiments of the invention achieve chief ray focus via rotation of a FAC lens downstream of the beam emitters, with or without rotation of a beam rotator downstream of the FAC lens, even in the absence of additional focusing optics. The rotation of the FAC lens generates a linear pointing effect across the beam emitters in the fast axis, in which fast-axis pointing changes linearly from one emitter to the next across the entire array of beam emitters. The beam rotator also rotates the fast and slow axes of the beams, typically by approximately 90°.

Embodiments of the present invention may also reduce the footprint of the laser system, increase output power of the output beam, and/or enable the brightness of the output beam to be adjusted (e.g., in real time and/or via feedback control). Through the various embodiments and techniques described herein a reduced-size, stabilized, variable brightness multi-wavelength output laser system may be achieved.

The approaches and embodiments described herein may apply to one- and two-dimensional beam combining systems along the slow axis, fast axis, or other beam combining dimension. In addition, the techniques may apply to external and non-external cavity wavelength beam combining systems.

Embodiments of the present invention may be utilized to couple the one or more input laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, vertical cavity surface emitting lasers (VCSELs), etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams (i.e., each diode in the bar emits a single beam).

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 μm×100 μm. The beam quality along the 1 μm dimension or fast-axis is typically diffraction-limited. The beam quality along the 100 μm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks. There are also horizontal diode stacks, and two-dimensional stacks. For the high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) is much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

In an aspect, embodiments of the invention feature a laser system that includes or consists essentially of a plurality of beam emitters, a fast-axis collimation (FAC) lens, a beam rotator, a dispersive element, and a partially reflective output coupler. Each beam emitter emits an individual beam that has a fast-diverging axis and a slow-diverging axis. The plurality of beam emitters are arranged in an array having a lateral dimension. The FAC lens is disposed optically downstream of the plurality of beam emitters, receives the emitted beams, and collimates the beams along their fast-diverging axes. The FAC lens has a lateral dimension rotated at a non-zero angle with respect to the lateral dimension of the plurality of beam emitters. The beam rotator is disposed optically downstream of the FAC lens, rotates the beams, and directs the rotated beams toward a dispersive element. The dispersive element receives and disperses the rotated beams. The rotation of the FAC lens with respect to the plurality of beam emitters may cause the rotated beams to at least partially (e.g., substantially completely) overlap at the dispersive element. The partially reflective output coupler receives the dispersed beams, reflects a first portion thereof back toward the dispersive element, and transmits a second portion thereof as a multi-wavelength output beam. The laser system may lack focusing optics optically downstream of the beam rotator and optically upstream of the dispersive element.

Embodiments of the invention may include one or more of the following in any of a variety of combinations. The beam rotator may flip the fast-diverging axis and the slow-diverging axis of each beam (i.e., rotate each beam by approximately 90°). The FAC lens may be discrete and separate from the beam rotator. The FAC lens and the beam rotator may be portions of a unitary (i.e., one-piece) optical element. The beam rotator may have a lateral dimension rotated at the non-zero angle with respect to the lateral dimension of the plurality of beam emitters. The beam rotator may have a lateral dimension rotated at a second non-zero angle with respect to the lateral dimension of the plurality of beam emitters. The second non-zero angle may not be equal to the non-zero angle. The beam rotator may have a lateral dimension that is not rotated with respect to the lateral dimension of the plurality of beam emitters. The dispersive element may include or consist essentially of a diffraction grating (e.g., a transmissive diffraction grating or a reflective diffraction grating).

In another aspect, embodiments of the invention feature a method for configuring a laser system. A plurality of beam emitters is provided. Each beam emitter emits an individual beam that has a fast-diverging axis and a slow-diverging axis. The plurality of beam emitters are arranged in an array having a lateral dimension. A fast-axis collimation (FAC) lens disposed optically downstream of the plurality of beam emitters is provided. The FAC lens has a lateral dimension. The FAC lens receives the emitted beams and collimates the beams along their fast-diverging axes. A beam rotator disposed optically downstream of the FAC lens is provided. The beam rotator rotates the beams and directs the rotated beams toward a dispersive element. A dispersive element for receiving and dispersing the rotated beams is provided. A partially reflective output coupler is provided. The partially reflective output coupler receives the dispersed beams, reflects a first portion thereof back toward the dispersive element, and transmits a second portion thereof as a multi-wavelength output beam having a beam size. The lateral dimension of the FAC lens is rotated with respect to the lateral dimension of the plurality of beam emitters to reduce the beam size of the output beam.

Embodiments of the invention may include one or more of the following in any of a variety of combinations. The lateral dimension of the FAC lens may be rotated with respect to the lateral dimension of the plurality of beam emitters until the beam size is substantially minimized. The relative rotation of the FAC lens and the plurality of beam emitters may be performed by rotating the FAC lens, rotating the plurality of beam emitters, or both. The rotation of the lateral dimension of the FAC lens with respect to the lateral dimension of the plurality of beam emitters may cause the rotated beams to at least partially overlap (e.g., substantially completely overlap) at the dispersive element. The beam rotator may have a lateral dimension. The lateral dimension of the beam rotator may be rotated with respect to the lateral dimension of the plurality of beam emitters. The lateral dimensions of the beam rotator and the FAC lens may be rotated by approximately the same angle with respect to the lateral dimension of the plurality of beam emitters. The lateral dimensions of the beam rotator and the FAC lens may be rotated substantially simultaneously. The beam rotator may flip the fast-diverging axis and the slow-diverging axis of each beam. The FAC lens may be discrete and separate from the beam rotator. The FAC lens and the beam rotator may be portions of a unitary optical element. The dispersive element may include or consist essentially of a diffraction grating (e.g., a transmissive diffraction grating or a reflective diffraction grating).

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially" and "approximately" mean±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 8A and 8B are schematic illustrations of beams from WBC systems being coupled into optical fibers with adjustable and/or variable beam quality in accordance with embodiments of the invention;

DETAILED DESCRIPTION

Figure 1A:
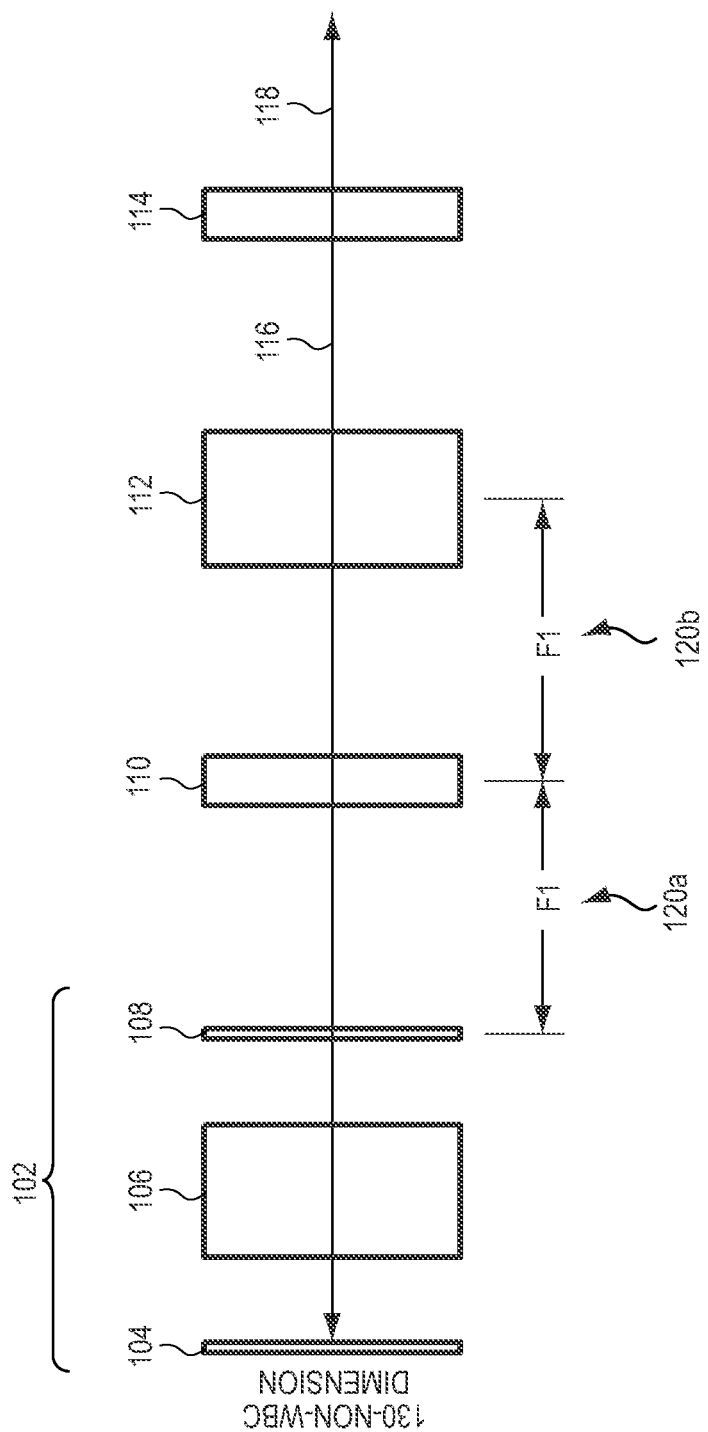
FIG. 1A is a schematic illustration of a conventional wavelength beam combining (WBC) laser system along a non-beam-combining dimension.
Figure 1B:
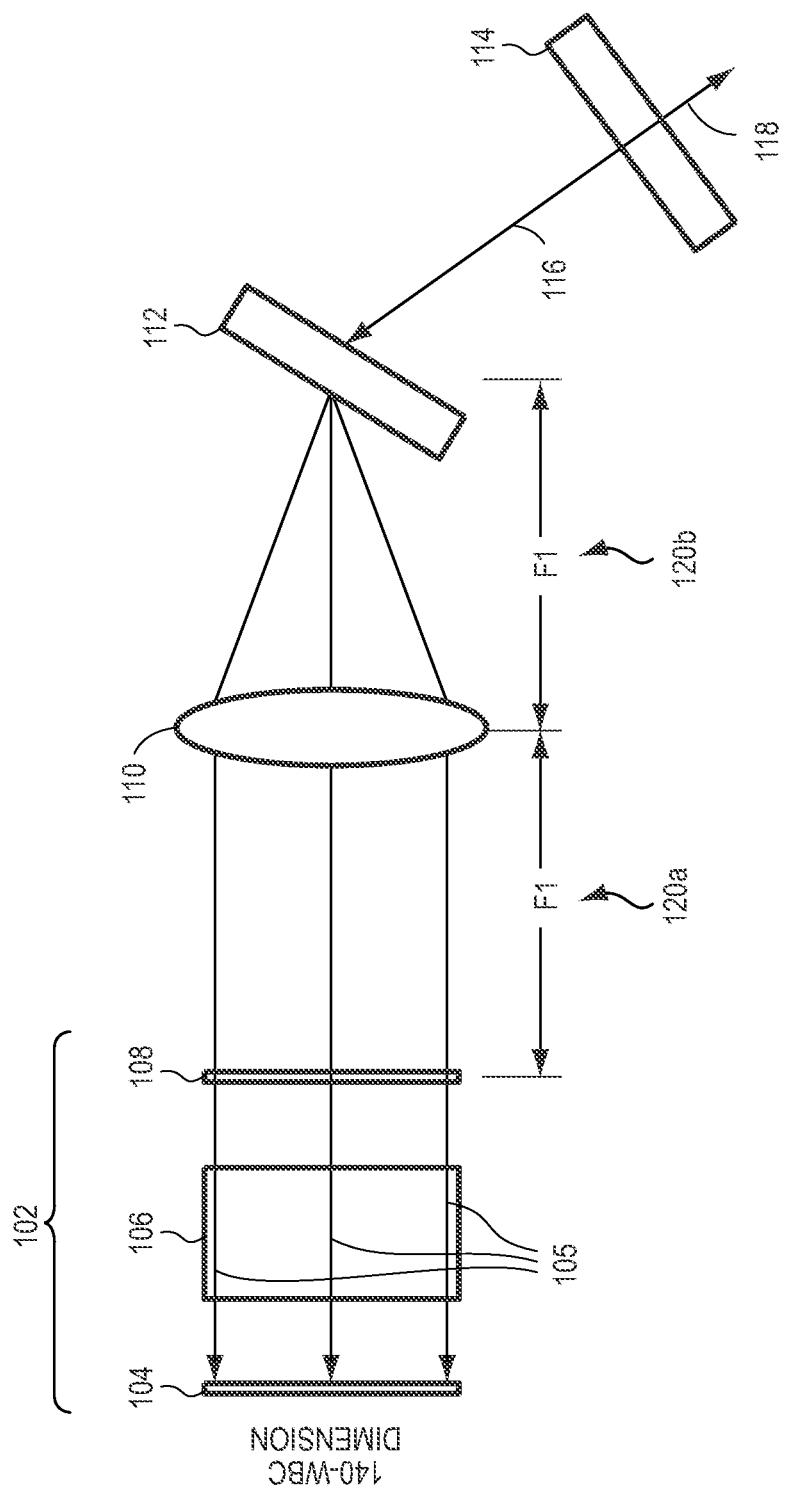
FIG. 1B is a schematic illustration of the WBC laser system of FIG. 1A along the beam-combining dimension.

FIGS. 1A and 1B illustrate a conventional external-cavity one-dimensional wavelength beam combining (WBC) laser system along a non-beam-combining dimension 130 (FIG. 1A) and along a beam-combining dimension 140 (FIG. 1B). As shown, such systems may include a one-dimensional diode bar 102 having a back reflective surface 104, a gain medium 106 with two or more diode emitters 105, a front reflective surface 108, a combining optic (or "focusing lens") 110, a dispersive element 112, and a partially reflecting output coupler 114. The combining optic 110 is typically placed an optical distance 120a away from the front reflective surface 108 of the diode bar 102, while the dispersive element 112 is placed an optical distance 120b away from combining optic 110, where both optical distances 120a, 120b are substantially equal to the focal length of the combining optic 110. The output coupler 114 is spaced away from the dispersive element 112 and reflects a portion 116 of the generated beams (feedback) to the dispersive element 112 and transmits a multi-wavelength output beam 118 that includes the wavelengths emitted by the various emitters 105. The combining lens 110 is typically placed to accomplish two functions. The first function is to overlap all the chief rays from all the diode elements onto the dispersive element 112. The second function is to collimate each beam in both axes.

Figure 2A:
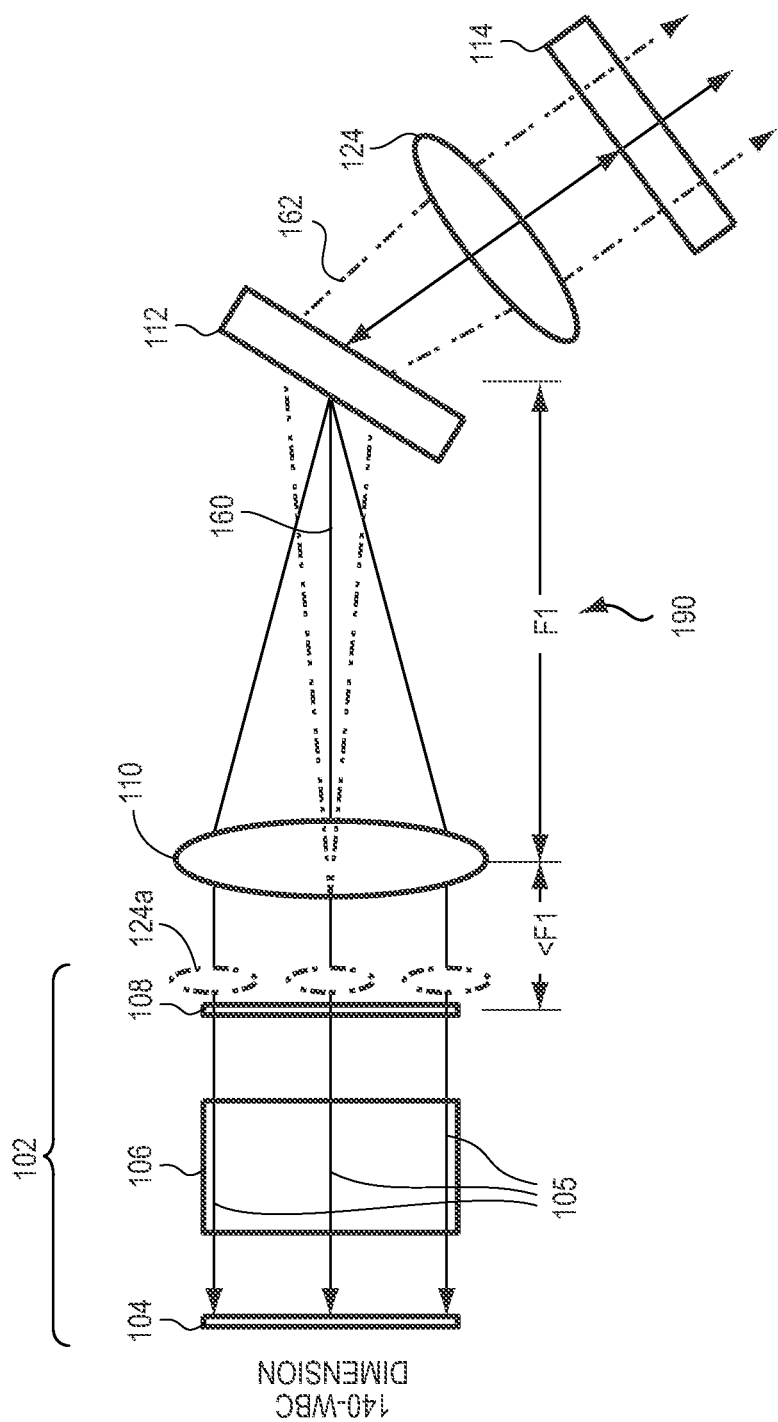
FIGS. 2A-2C are schematic illustrations of WBC laser systems with non-confocal focusing optics in accordance with embodiments of the invention.
Figure 2B:
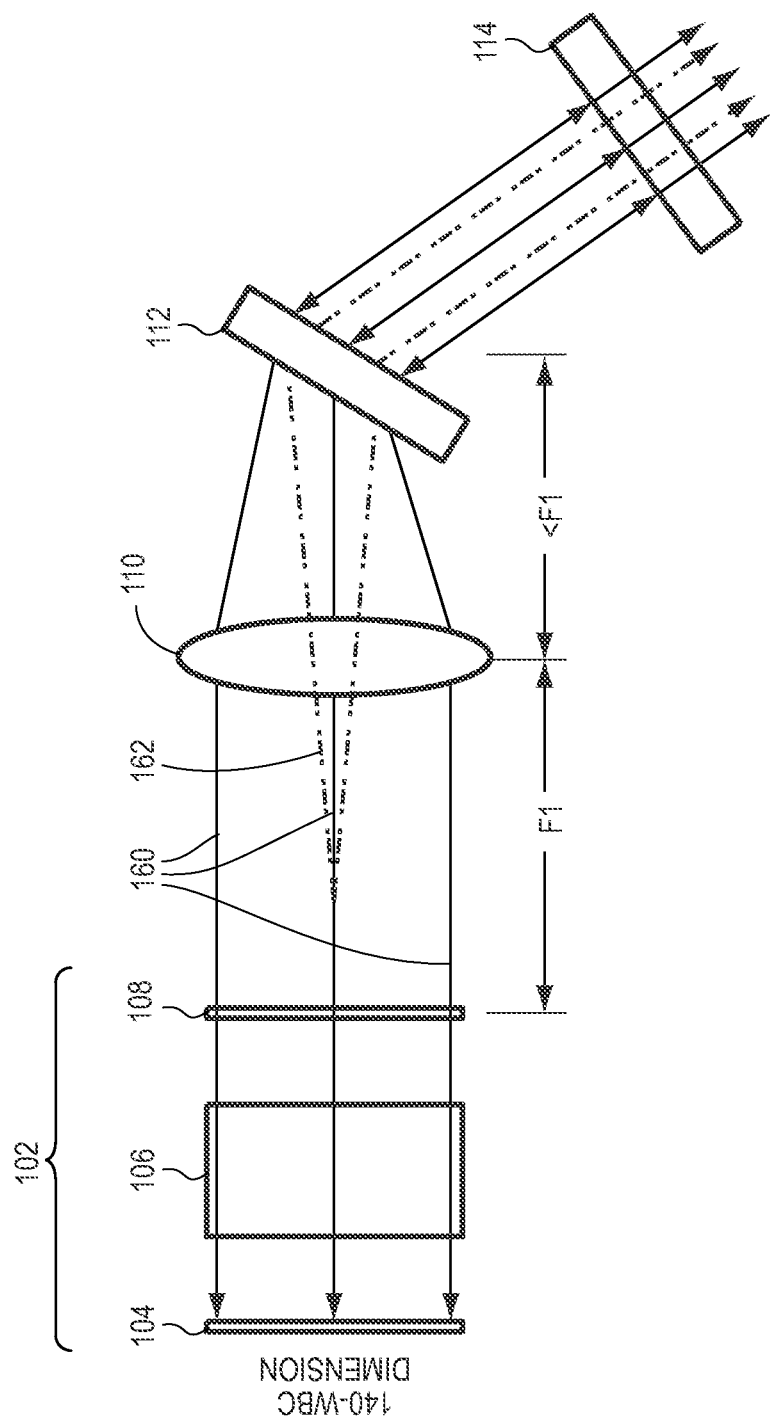

However, more compact WBC systems, such as those shown in FIGS. 2A and 2B, may be achieved by intentionally placing the diode bar 102 or dispersive element 112 at a position other than the focal plane of the combining optical element 110. If the combining optical element 110 is placed less than a focal length from the diode bar 102, than an additional collimating optic(s) 124 may be placed before or after the dispersive element 112 and before the partially reflective output coupler 114 as shown in FIG. 2A. This allows the optical path length between the diode bar and output coupler to be reduced by almost (or substantially) a full focal length of combining element 110, for example when combining element 110 is placed adjacent to the front surface/facet 108 of diode bar 102.

In a variation of this embodiment, collimating optic(s) 124a may be individually placed in front of each emission point along the front surface/facet of the diode bar and before the combining optical element 110, which still results in a more compact WBC system. In this variation, the collimating optic(s) 124a may include or consist essentially of an array of micro-optical fast-axis collimating (FAC) lenses, slow-axis collimating lenses (SAC) or combination of both. Collimating each beam helps to ensure that proper wavelength stabilization feedback is received into each of the diode elements. This helps each diode element produce a unique wavelength that is stabilized and less susceptible to shifting, and thus a multi-wavelength output beam profile of high brightness and high power may be achieved.

As shown in FIG. 2A, the dispersive element (e.g., a diffraction grating) is placed substantially at the back focal plane of the focusing lens. As shown, to a first approximation, the lens with focal length 190 only converges the chief rays for each of the diode elements. This may be understood from the Gaussian beam transformation by a lens equation $1/(s+z_r^2/(s-f))+1/s''=1/f$, where s and s'' are the input and output waist locations, $z_r$ is the Raleigh range, and f is the focal length. Thus, the chief rays 160 are overlapping at the grating while each beam is still diverging and thus forming diverging rays (shown as dashed lines). The diverging rays may or may not be later collimated by an optical element, such as optical element 124. With all the diode element beams overlapped on the dispersive element 112, the output beam quality is generally that of a single emitter. Again, one advantage of this system is that the size may be considerably smaller, as it does not require an optical spacing between diode elements and the dispersive element equal to twice the focal length of the lens 110. In some embodiments, the beam path is reduced by almost half or more. The spacing between various elements as described herein may be slightly longer, equal to, or slightly shorter than the focal length 190.

Alternatively, an embodiment devoid of collimating optic (s) 124 is illustrated in FIG. 2B. Combining optical element 110 is placed a focal length from the front facet 108 and as a result collimates the light from each diode element. A reduced system size is still achieved by placing dispersive element 112 less than a focal length from combining optical element 110. The brightness of the multi-wavelength beam is still increased as compared to the initial array of beams produced by diode bar 102.

As shown in FIG. 2B, the dispersive element 112, is placed much closer than the back focal plane. However, the penalty of such a system is there is some degradation in the output beam quality. To further illustrate, in one variation of this embodiment, it is assumed that the diode elements 102 are a single 10-mm wide bar with 47 emitters. Each emitter may have a FAC lens (not shown) and no SAC lens. Inclusion of a SAC lens does not change the exemplary results detailed here. The focal length of the FAC lens in this variation is 910 μm. In this variation, the diode bar is operating at a 1 μm wavelength. With each beam being diffraction limited along the fast axis, the typical full divergence after the FAC lens is about 1 milliradian (mrd). Along the slow-axis the beam is diverging about 100 mrd. We assume that the combining optical element 110 or transform lens has a focal length of 150 mm. The output beam quality is approximately $M^2=(\theta \times \pi/(4 \times \lambda)) \times \sqrt{(z \times x/f)^2+1}$, where $\lambda=1$ μm, z is the distance after the lens to the grating and center at the back focal plane, x is the dimension of the array (e.g., 10 mm), and θ is the individual beam divergence after the grating.

Figure 6:
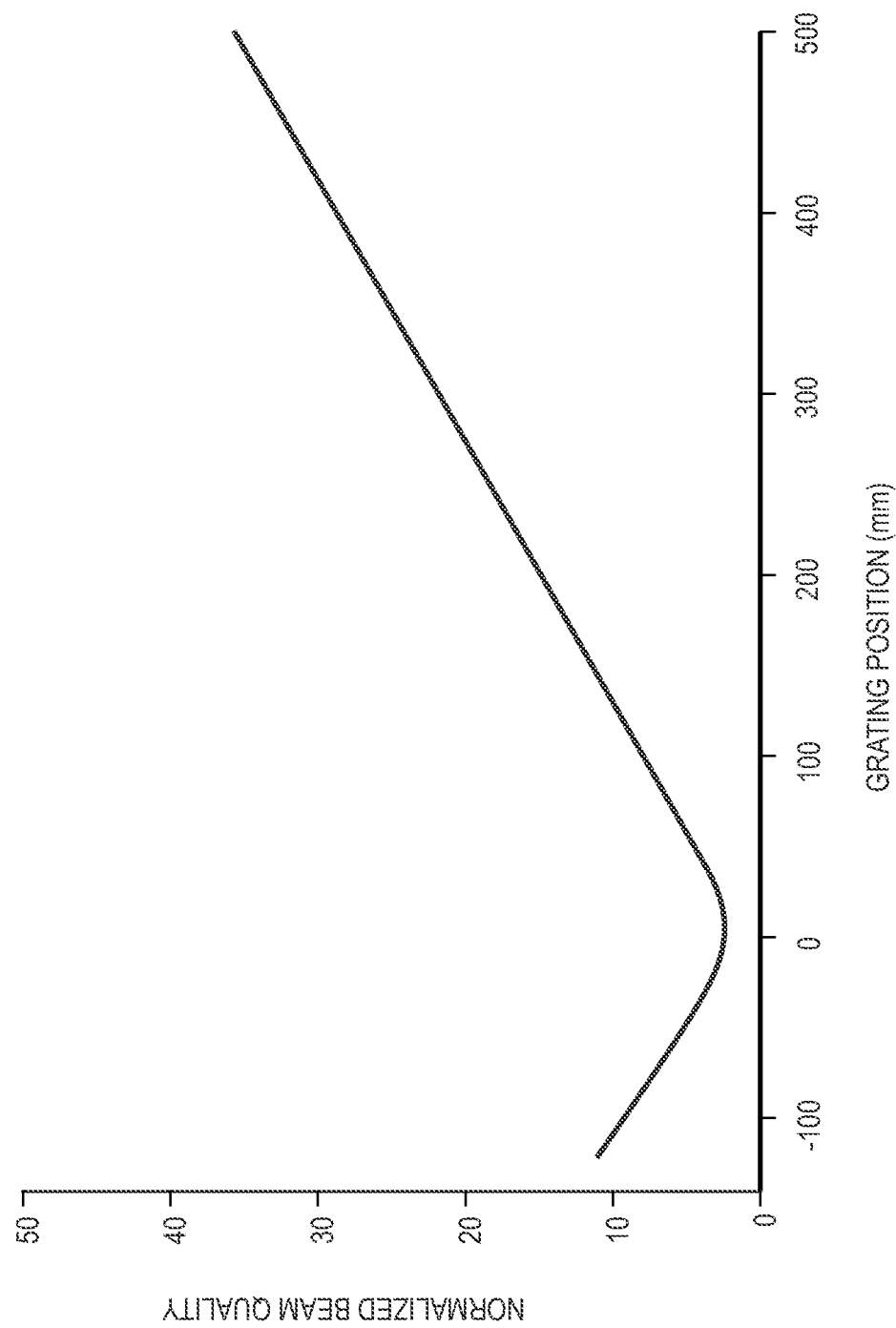
FIG. 6 is a graph of normalized beam quality as a function of the position of the dispersive element for an exemplary WBC laser system of FIG. 2B in accordance with embodiments of the invention.

FIG. 6 is a graph illustrating the approximate output beam quality as a function of grating position. The output beam quality is normalized to the ideal case where the grating is at the back focal plane of the optics. As expected at z=0 or the back focal plane the normalized beam quality is 1 and grows to about 33 times at z=500. The normalized free-running beam quality is about $M^2 \sim 47/ff=47/0.5=94$, where ff is the near field fill-factor of the diode emitter. Thus, even at z=500, the beam quality of the system is still better than free a running system, one without WBC, by about three times. In FIGS. 1A and 1B, the combining element 110 also acted as the collimating element. In FIG. 2A the function of the combining element 110 is primarily to focus the chief rays 160 onto the dispersive element 112 and an additional collimating element 124 is placed after the dispersive element 112 generally at the focal plane of 124 to collimate the diverging rays 162. In FIG. 2B, combining element 110 is placed at approximately a focal length from the front aperture 108 and collimates the diverging rays, but because of the shortened distance from combining element 110 to dispersive element 112, the chief rays do not completely overlap onto each other as in typical conventional WBC arrangements. The multi-beam output still has an increase in brightness, but as suggested by FIG. 6 is not at optimal brightness.

Figure 2C:
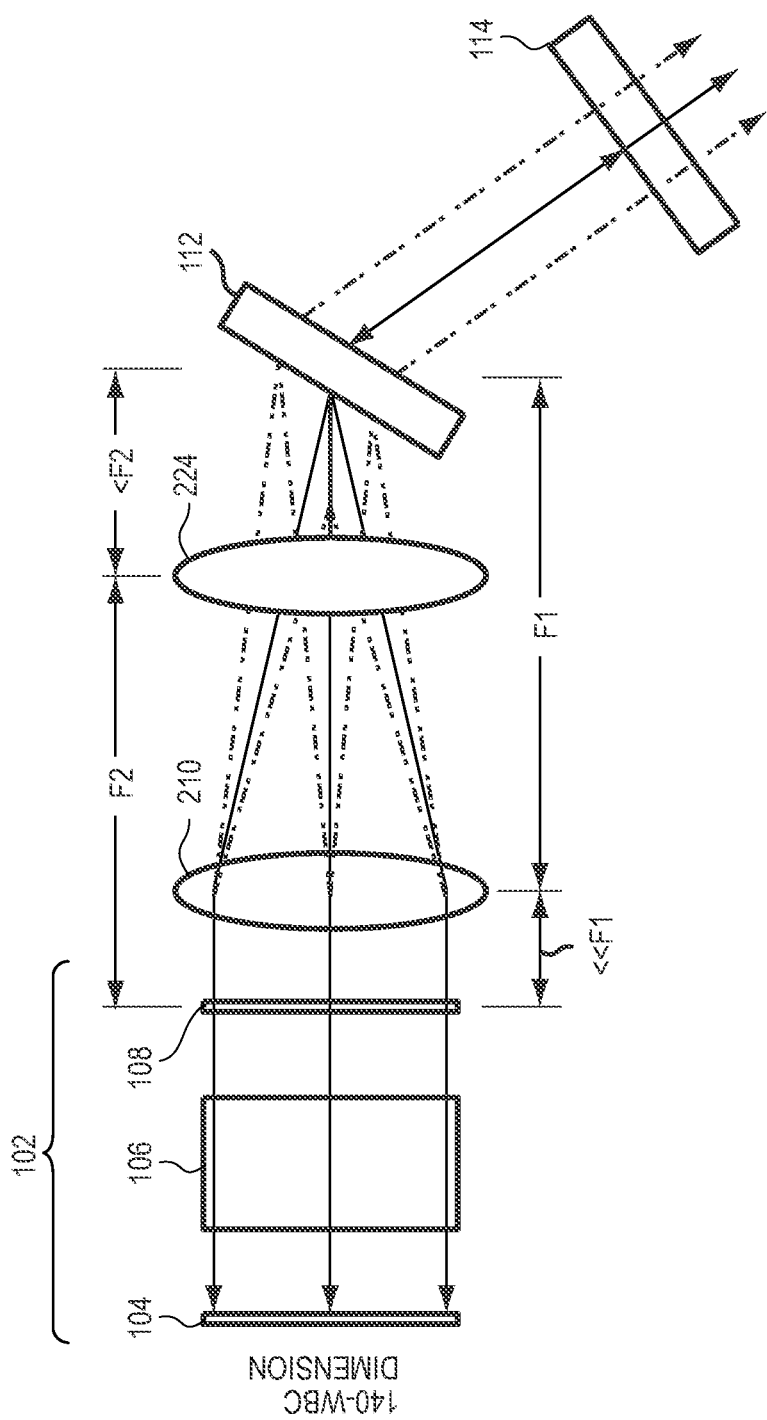

FIG. 2C illustrates a WBC system that enables a shortened beam pathway and substantially separates the functionality of combining chief rays and collimating diverging rays into two separate optical elements (or systems) positioned before the dispersive element. A combining element 210 is positioned at a distance substantially less than its respective focal length F1 away from the front aperture 108 on one side and approximately a focal length F1 away from the dispersive element 112 on the other side. This allows combining element 210 to direct the chief rays from each diode emitter of diode bar 102 to overlap or substantially overlap on the dispersive element 112. At the same time, a collimating optical element 224 is placed approximately a focal distance F2 away from the front aperture of each diode emitter on one side and at a distance less than focal length F2 from the dispersive element on the other side. Similarly, the primary function of the collimating optical element 224 is to collimate the diverging rays. One skilled in the art will readily acknowledge that both optical elements 210, 224 have optical power along the same dimension and as a result will have some effect on the actual placement of each optical element with respect to the front aperture and dispersive element. However, this interdependency is managed in-part by the placement of each optical element substantially close to the front aperture on one side and the dispersive element on the other side. Thus, the combining optical element 210 primarily dominates the combining of the chief rays on the dispersive element 112, but is influenced by the prescription of collimating optical element 224 and vice versa.

Figure 3:
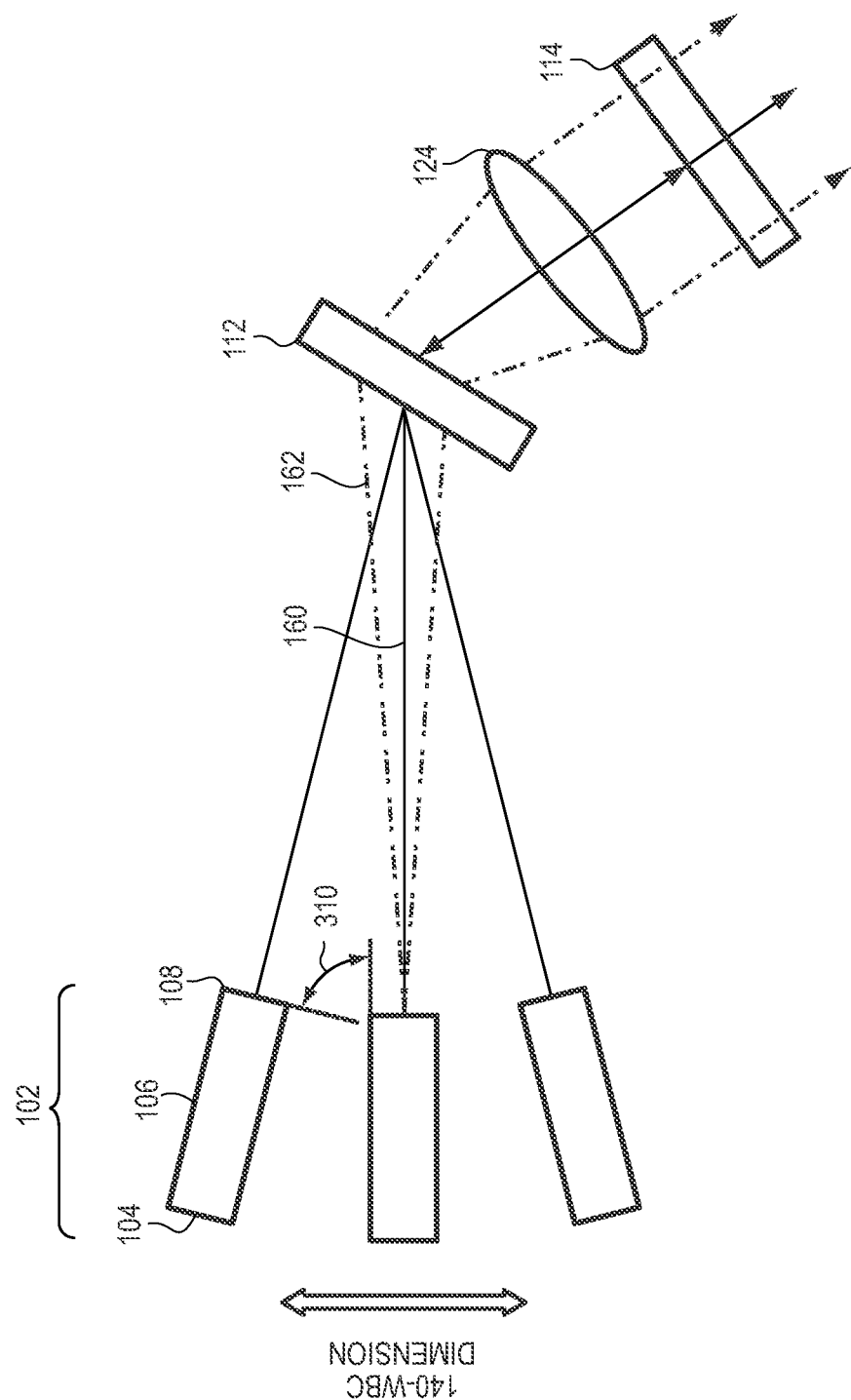
FIG. 3 is a schematic illustration of a WBC laser system lacking focusing optics upstream of the dispersive element in accordance with embodiments of the invention.

Other embodiments described herein also reduce system size and even the need for an optical combining element(s) through using alternative position-to-angle methods. For example, FIG. 3 illustrates a WBC system devoid of an optical combining element. Each diode bar 102 (which in some cases may include or consist essentially of only a single diode emitter) may be mechanically positioned in a manner that the chief rays 160 exiting the diode bars 102 overlap at a common region on the dispersive element 112 as shown. (In other variations of this embodiment, and similar to FIG. 2B, the beams do not completely overlap at the dispersive element, but the spatial distance between each along a combining dimension is reduced.) The diverging rays 162 (dashed lines), are later collimated by collimating optic(s) 124 positioned between the dispersive element 112 and the partially reflective output coupler 114. (Some variations of this embodiment include replacing collimating optic 124 with individual FAC and/or SAC lenses positioned at the front surface or facet of each diode bar.) This embodiment thus increases brightness while reducing the number of optical elements required as well as reducing overall system size.

Figure 4:
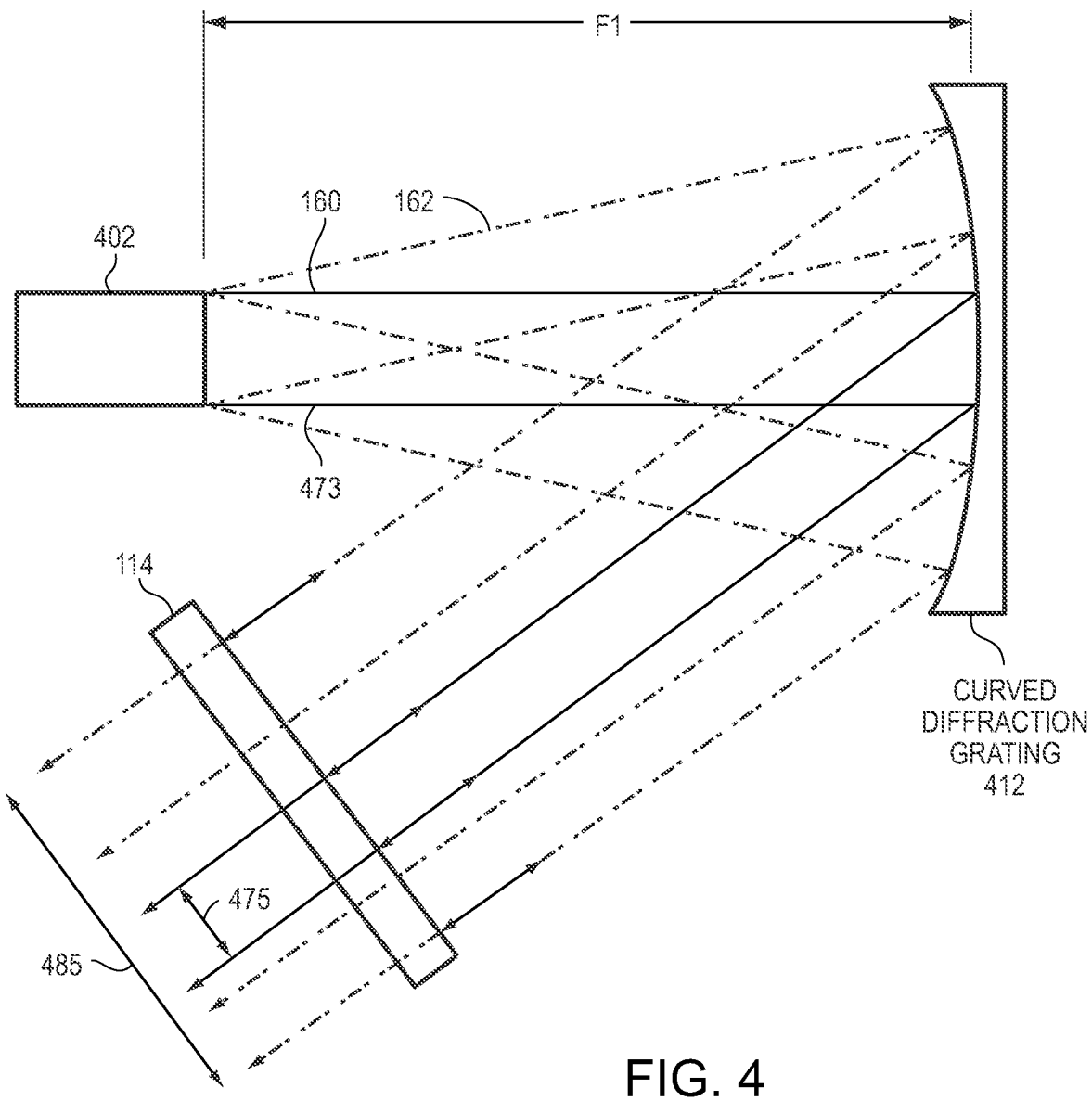
FIG. 4 is a schematic illustration of a WBC laser system utilizing a curved dispersive element in accordance with embodiments of the invention.

In another embodiment shown in FIG. 4, a curved diffraction grating 412 is placed a focal length F1 from the diode bar 102. The curved diffraction grating combines the emitted beams into a multi-wavelength beam that is transmitted to the partially-reflective output coupler 114, where a portion is reflected back towards the curved diffraction grating 412. The wavelengths of the reflected beams are then filtered by the diffraction grating and transmitted back into each emitter of diode bar 102, where each emitter is stabilized to a particular wavelength. The limitation of brightness in this type of system generally hinges on the amount of power the curved diffraction grating can handle. This embodiment illustrates an optical architecture reducing the number of optical elements and shortening the beam path while increasing the brightness of a multi-wavelength output beam. Any degradation of the beam quality results as a function of the width 475 over the entire distance of the beam profile 485.

Figure 5A:
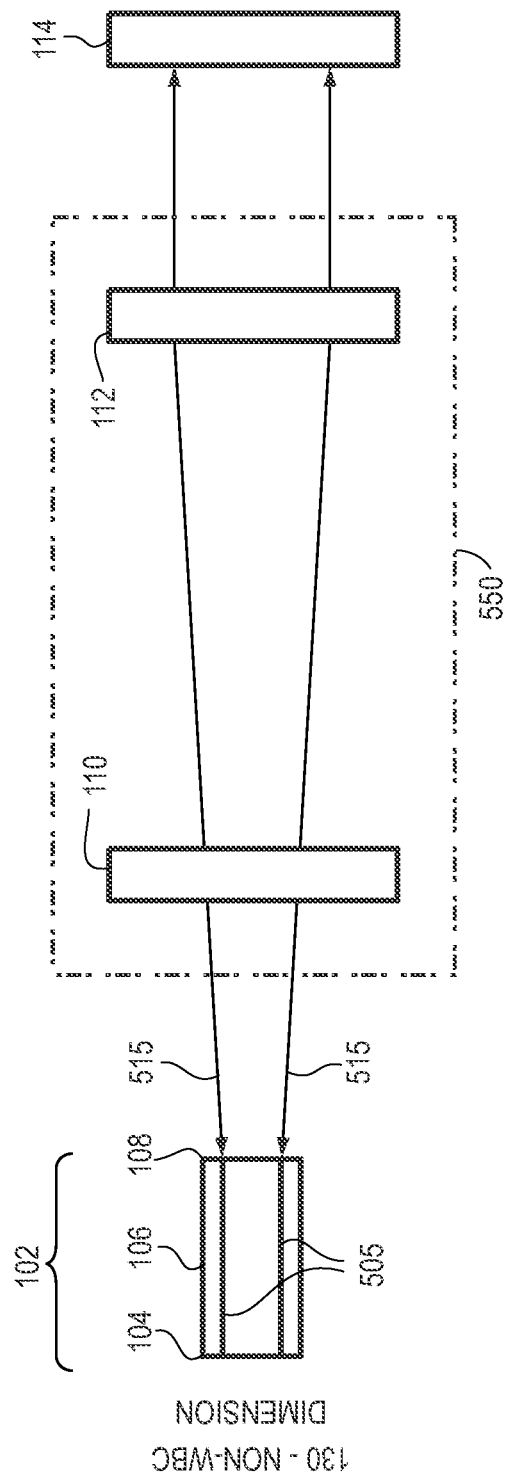
FIGS. 5A-5C are schematic illustrations of WBC laser systems incorporating spatial combining optical systems configured to substantially overlap wavelength feedback along a non-beam-combining dimension in accordance with embodiments of the invention.
Figure 5B:
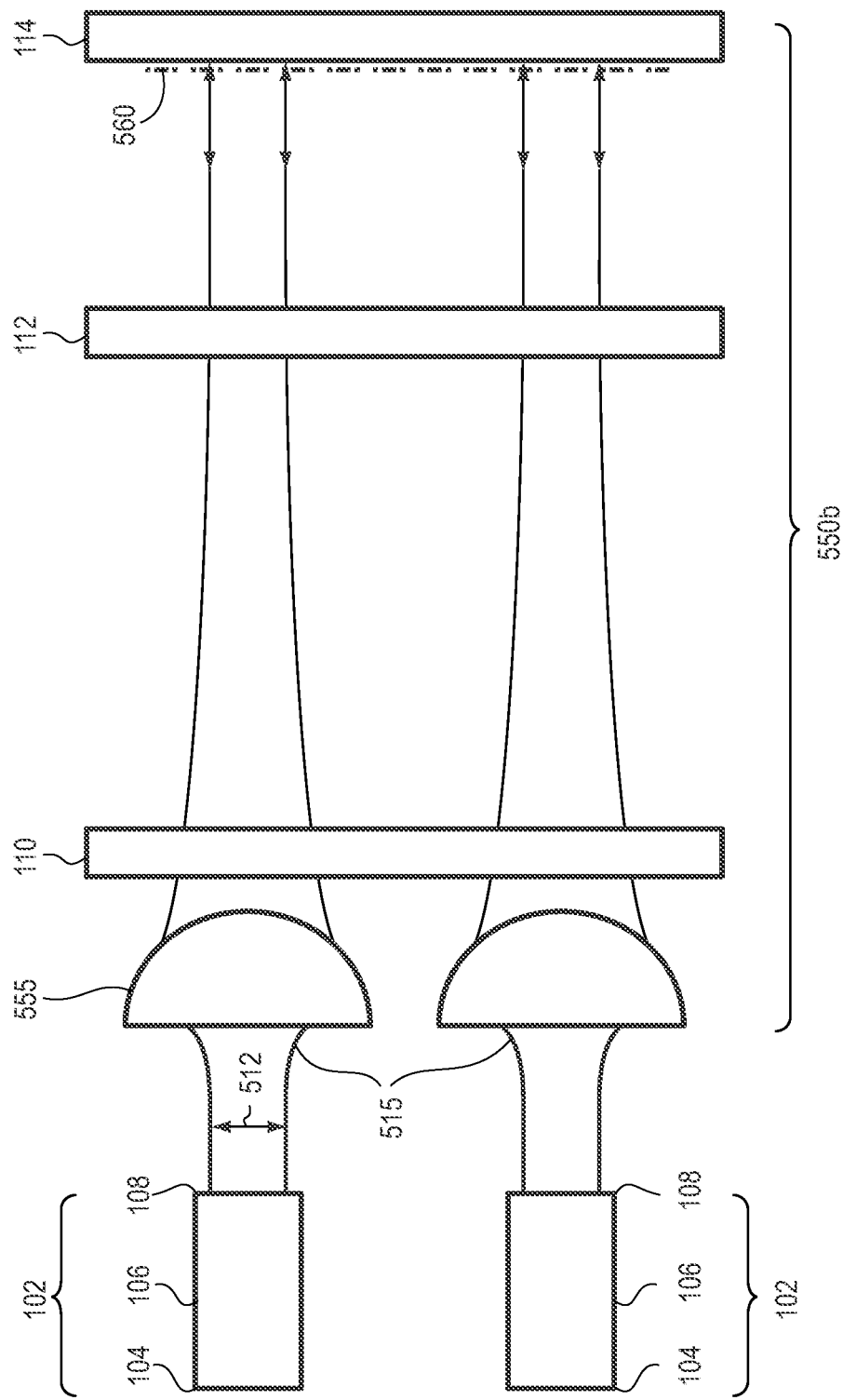
Figure 5C:
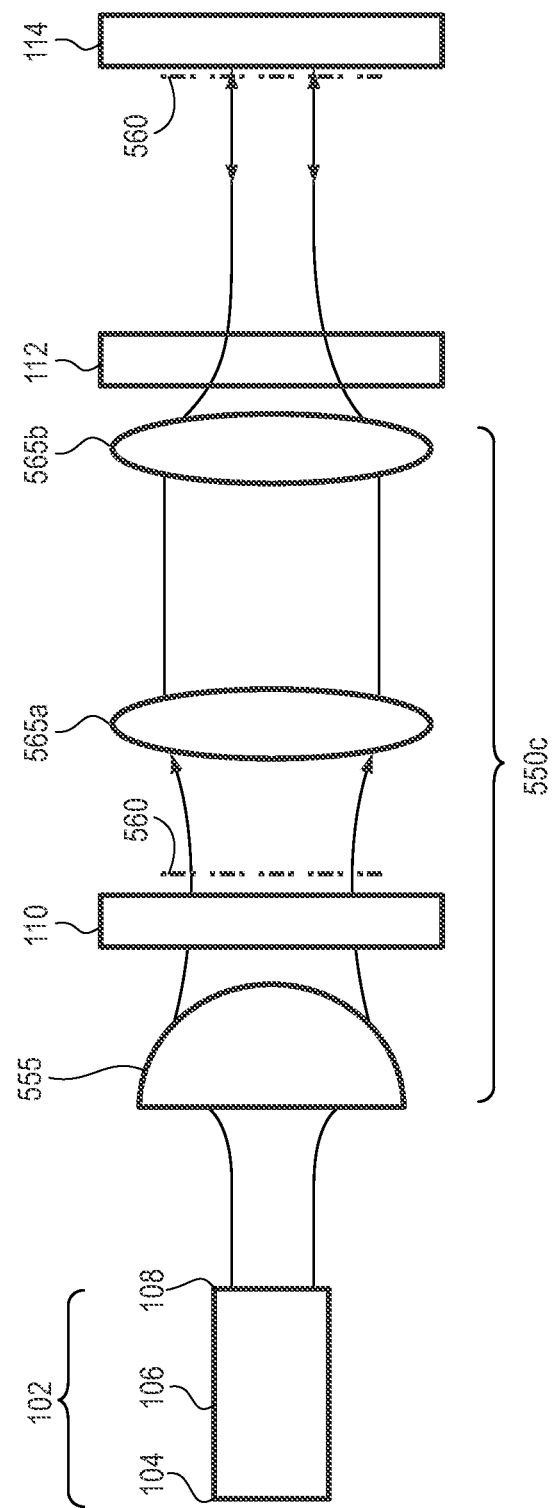
Figure 7A:
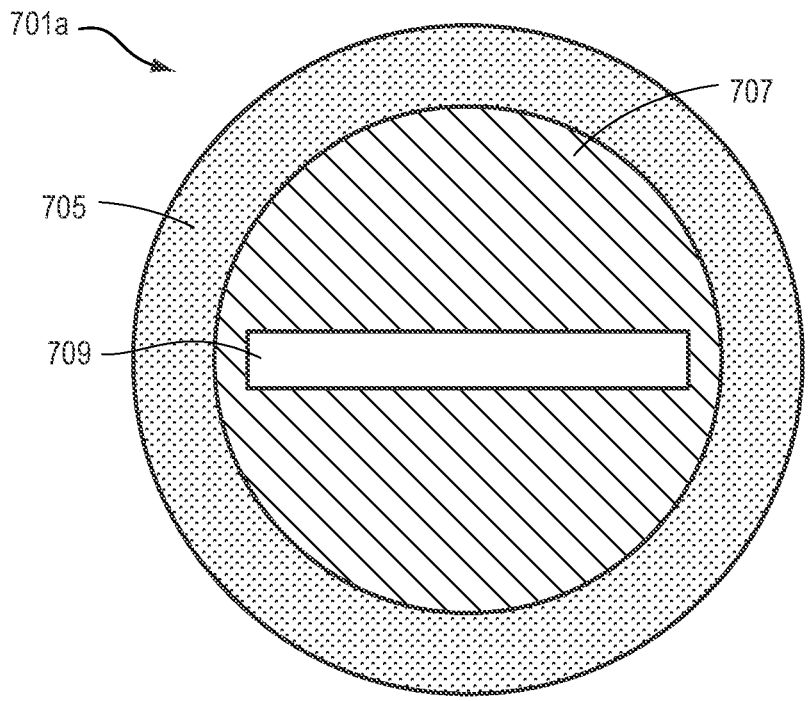
FIGS. 7A and 7B are schematic illustrations of beams from WBC systems in-coupled into optical fibers in accordance with embodiments of the invention.
Figure 7B:
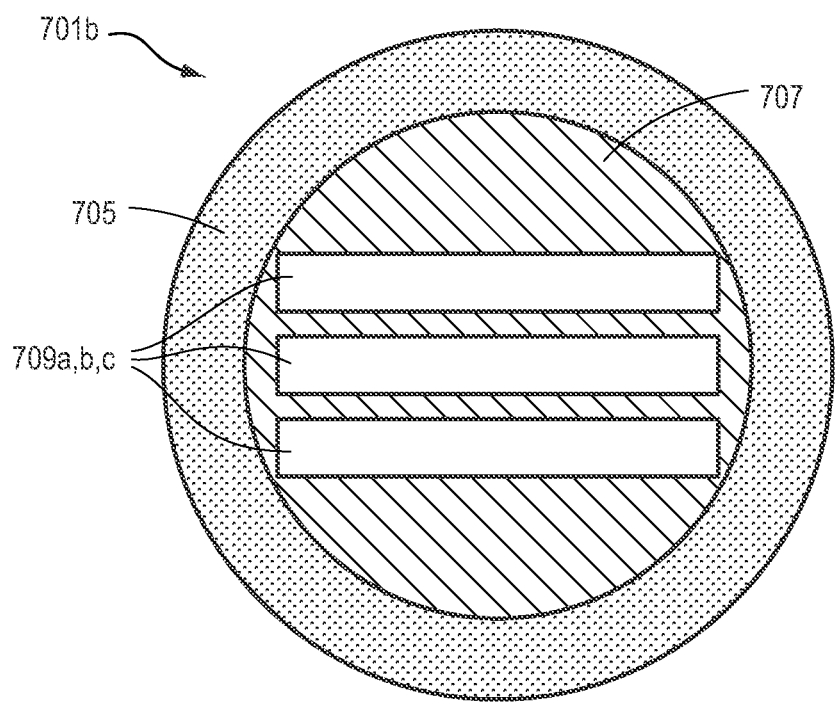

FIGS. 5A-5C illustrate various embodiments of spatial combiners incorporated along the non-beam combining dimension 130 of a WBC system that help to increase the amount of system output power that may be coupled into a fiber (e.g., as illustrated in FIGS. 7A and 7B). FIG. 5A illustrates a simple black box model, showing a spatial combiner 550 that may be configured in various ways. The key concepts are to overlap feedback for each beam along its original pathway along the non-combining dimension to be received back into each of the original emission points or emitters. The feedback is often the result of the partially-reflective output coupler 114, which reflects a portion of the multi-wavelength beams. For example, two optical pathways 515, as shown in FIG. 5A, are where beams or multiple beams of radiation travel through the spatial combiner 550, which helps to overlap the radiation reflected by output coupler 114, back into the emitters 505, thus forming a stabilized system.

FIG. 5B illustrates one embodiment of a system utilizing a spatial combiner in which multiple lenses 555 image the beam waist of each emitter (or array of emitters) from each diode bar 102 onto or near the partially-reflective output coupler 114. This helps the two-dimensional array of emitters (here shown as two diode bars having at least one emitter each) from diverging too quickly, properly guiding feedback into the original emitters, thus stabilizing each emitter along the non-beam combining dimension and allowing the multi-wavelength output to be in a compact form. FIG. 5C illustrates an embodiment having a spatial combiner 550c that uses a lens 555 and an afocal telescoping system (565a, 565b) to keep the reflected beams overlapping the original pathways and thus stabilizing each of the emitters.

FIGS. 7A and 7B illustrate an effect of spatial beam combining on fiber coupling. As shown in FIG. 7A, an optical fiber 701a has a cladding 705 and core 707 configured to receive a multi-wavelength beam 709. Multi-wavelength beam 709 is usually formed by combining single row (one dimension) of diode emitters (often generated by a single diode bar) into the size of a single element configured to be received by the core 707. However, in two-dimensional or multi-row/array diode emitters configurations (which may include, e.g., multiple diode bars) a spatial combiner, such as those described in FIGS. 5A-5C, may be used to configure a multi-wavelength beam profile that has the size of three original elements/emitters stacked in a single column three into a similar sized core 707 of an optical fiber 701b. For example, one bar may include or consist essentially of 49 emitters that are reduced to approximately the size of one emitter. Stacking or arranging optically or mechanically three bars with 49 emitters each a profile 709a,b,c (709a, b and c each representing a row or diode bar) may produce a multi-wavelength beam configured to be received into an optical fiber that increases the brightness and power by a factor of three times.

As described above, various spacing between the diode emitters, combining optical element and dispersive element have been discussed (including those systems devoid of an optical combining element). Also disclosed in FIG. 6 was a graph illustrating the normalized beam quality measured in terms of beam parameter product (BPP). The BPP of each system described herein may adjusted from a low BPP to a higher BPP. In laser manufacturing, cutting, and welding, various materials, thickness, type of cuts, etc. may require a laser to have a flexible output based on BPP. Some materials require the highest quality beam output (or lowest BPP available) to cut; however, in other circumstances where the parameters of the material, cut, and/or thickness have been altered, the same high quality may be insufficient to efficiently perform the desired task. Thus, the WBC system may be intentionally adjusted to reduce beam quality in order to more effectively accomplish a particular manufacturing task. Therefore, in embodiments of the invention, adjustable positioning of diode emitters with respect to the dispersive element, diode emitters with respect to the combining optical element, combining optical element with respect to the dispersive element, help to create a flexible WBC laser system that may accomplish a greater range of tasks. These adjustable position configurations may include manual and real-time adjustments, e.g., thin metal applications and thick metal applications, as well as the type of metal to be cut, which sometimes require different cutting parameters relative to beam quality. In another embodiment, in addition to linearly positioning the beams and elements along the beam combining dimension, the angular position of at least one of the beams is repositionable. This repositioning may be automated that it may occur in real time. One way of accomplishing this is by placing a rotatable optical element, such as a piece of glass, after the multi-wavelength output of the WBC system and prior to a fiber optical mount (FOM).

FIGS. 8A and 8B illustrate an embodiment incorporating a rotatable optical element 820 (or beam path adjuster) in the optical pathway 815 containing the multi-wavelength output beam from WBC system 810 to a FOM 825 configured to direct the multi-wavelength beam into fiber 830 with its associated numerical aperture (NA) and width. FIG. 8A illustrates a configuration in which the rotatable optical element 820 has a surface normal to the optical pathway 815, thus allowing the optical pathway to continue on to the FOM 825 with no or minimal interference. Alternatively, rotatable optical element 820 may be positioned so that the surface is offset at a non-normal angle, causing the multi-wavelength beam to be redirected to a point 822 and thus follow a new optical path 817 that is offset by a distance 824 from an unaltered optical pathway 819. This causes an angle 826 at which the multi-wavelength beam enters fiber 830 from FOM 825 to increase. This increase in angle reduces the quality of the multi-wavelength beam (i.e., increases its BPP). As stated, in some instances a less bright beam is actually more desirable for particular applications, thus having a tunable or adjustable WBC system may be configured to accomplish various tasks at optimal settings for those particular tasks. In some embodiments, the rotatable optical element 820 may be manually adjusted while in others the rotation process may be automated. In yet other configurations in which the output beam quality of the system is adjustable, the output power of each emitter may adjusted from completely off to full power output.

Figure 9A:
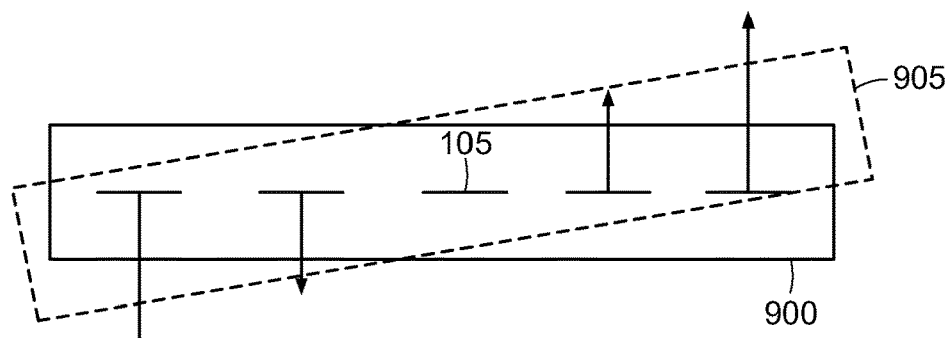
FIG. 9A is a head-on schematic of fast-axis collimation lens rotation with respect to an array of beam emitters in accordance with embodiments of the invention.
Figure 9B:
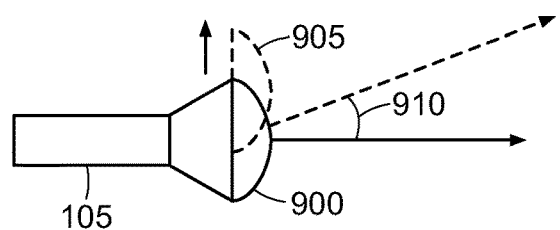
FIG. 9B is a lateral schematic of effective positions of the fast-axis collimation lens and one of the beam emitters of FIG. 9A before and after rotation in accordance with embodiments of the invention.

As mentioned above, WBC laser systems in accordance with various embodiments of the present invention feature a FAC lens and a beam rotator downstream of the array of beam emitters. Rotation of the FAC lens (itself only or along with the beam rotator) relative to the array dimension of the beam emitters enables chief ray focus of the beams emitted by the beam emitters and, thus, overlap of the individual beams at the dispersive element. (Herein, relative rotation of the beam emitters and the FAC lens is understood to include rotation of the array of beam emitters, rotation of the FAC lens, or both, so long as there is an angle of rotation introduced therebetween.) Achievement of chief ray focus of the beam emitters at an optical distance substantially equal to the optical distance between the beam emitters and the dispersive element results in beam quality in the fast axis to be substantially equal to the beam quality of any one of the beam emitters. FIGS. 9A and 9B illustrate the impact of rotation of a downstream FAC lens on emitted beams. FIG. 9A is a head-on view facing the emission face of an array of beam emitters 105, each of which is designated by a horizontal line. Rotation of the FAC lens from an unrotated configuration 900 (designated by the solid outline) to a rotated configuration 905 (designated by the dashed outline) induces fast-axis pointing (i.e., variation in the orientation of the fast axis, designated by the vertical arrows) in the individual beams. As shown in FIG. 9B, which is a side view of an individual emitter 105 and a FAC lens, the magnitude of the fast-axis pointing is generally a function of the change in relative position between the FAC lens and the emitter 105 when the FAC lens is rotated from configuration 900 to configuration 905. As shown, the relative change in vertical position of the FAC lens results in fast-axis pointing of an angle 920.

Figure 9C:
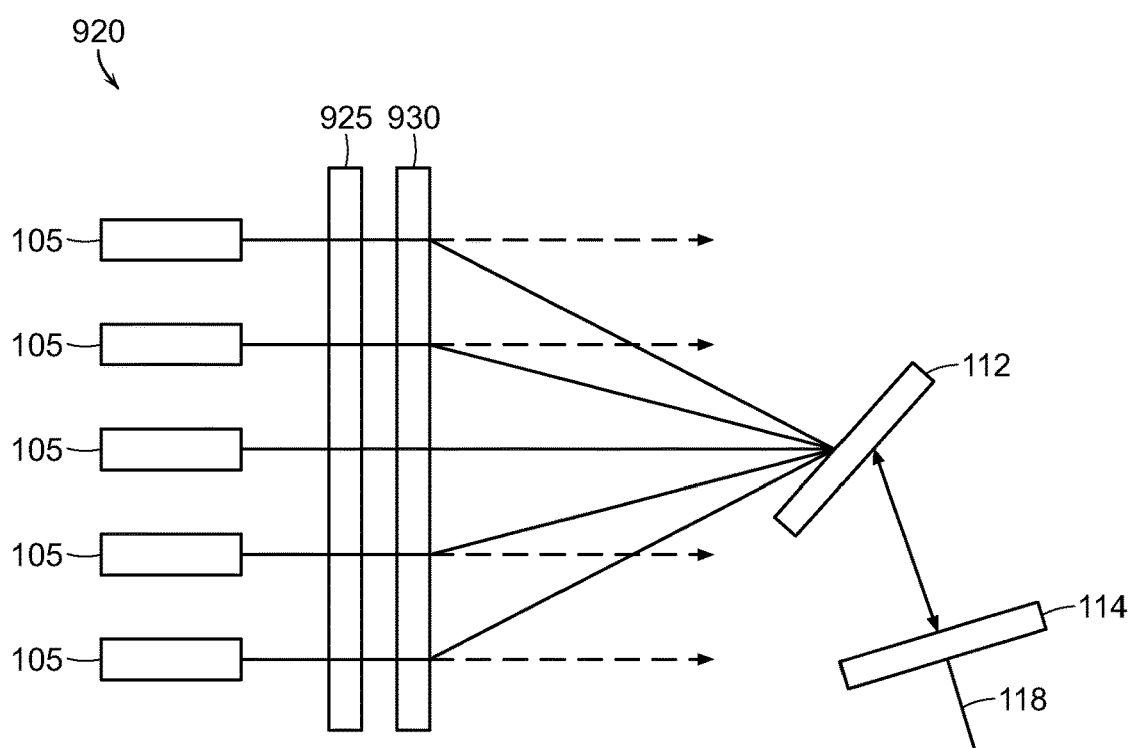
FIG. 9C is a schematic illustration of a WBC laser system incorporating a rotatable fast-axis collimation lens to converge each individual beam emitted by an array of beam emitters in accordance with embodiments of the invention.

FIG. 9C depicts a WBC system 920 that incorporates an array of emitters 105, a FAC lens 925, and a beam rotator 930. FIG. 9C depicts WBC system 920 as including five emitters 105, but embodiments of the invention may include more or fewer than five emitters 105. For example, the emitters 105 may be individual diodes in a diode bar or in an array of diode bars. The beam rotator 930 rotates the fast and slow axes of the beams (by, e.g., approximately 90°, thereby flipping the fast and slow axes) emitted by emitters 105, and beam rotator 930 may include or consist essentially of, e.g., two spaced-apart cylindrical lenses or a unitary optical element having the same beam-rotation properties as two spaced-apart cylindrical lenses. The FAC lens 925 (and, in some embodiments, the beam rotator 930) is rotatable with respect to the array of beam emitters 105 as shown in FIG. 9A. In fact, in the configuration pictured in FIG. 9C, at least the FAC lens 925 is rotated with respect to the array of beam emitters 105, as the beams emitted by the beam emitters 105 are converging onto (and substantially overlapping each other at) the dispersive element 112 once the beams propagate through the FAC lens 925 and the beam rotator 930. The dispersive element 112 disperses the beams, a portion of which is reflected by the partially reflective output coupler 114 back to the emitters 105, and a second portion of which passes through the partially reflective output coupler 114 as multi-wavelength output beam 118. FIG. 9C also depicts, in dashed lines, the paths upon which the beams would propagate absent rotation of the FAC lens 925.

As mentioned herein, in various embodiments of the invention the FAC lens 925 is rotated with respect to the emitters 105 while the beam rotator 930 is not. In other embodiments, both the FAC lens 925 and the beam rotator 930 are rotated with respect to the array of emitters 105 (e.g., by approximately the same angle with respect to the emitters 105). In various embodiments, the FAC lens 925 and the beam rotator 930 are portions of a single unitary optical element that is rotated with respect to the emitters 105 such that the beams converge at the dispersive element 112. Although FIG. 9C depicts the beams from emitters 105 converging to and overlapping upon the dispersive element 112 without any additional focusing optics disposed optically between the beam rotator 930 and the dispersive element 112, in various embodiments the FAC lens 925 (and, in some embodiments, the beam rotator 930) is rotated with respect to the emitters 105, but the angle of rotation is insufficient to achieve complete overlap of the beams at the dispersive element 112 (for example, the optical distance between the beam rotator 930 and the dispersive element 112 may be insufficient to achieve substantially complete beam overlap). In such embodiments, additional focusing optics may be disposed optically between the beam rotator 930 and the dispersive element 112 in order to provide further focusing of the beams so that they overlap at the dispersive element 112. Such focusing optics may be disposed at an optical distance less than its focal length from the beam rotator 930 and/or the dispersive element 112, e.g., as described herein and in U.S. patent application Ser. No. 14/667,094, filed on Mar. 24, 2015, the entire disclosure of which is incorporated herein by reference.

In various embodiments of the invention, the angle of rotation of the FAC lens 925 (and, in some embodiments, of the beam rotator 930) is configured (e.g., during set-up of the system 920) via feedback from the multiple-wavelength output beam 118. In various embodiments, the WBC system 920 is set up as pictured in FIG. 9C with the FAC lens 925 (and, in some embodiments, the beam rotator 930) rotated at a first angle (which may be approximately 0°) with respect to the beam emitters 105. The fast-axis beam size at the output coupler 114 (e.g., of the output beam 118) is monitored, and the FAC lens 925 (and, in some embodiments, the beam rotator 930) is rotated to one or more angles different from the first angle until the fast-axis beam size at the output coupler 114 is minimized. This minimum beam size indicates that the beams emitted by emitters 105 are substantially overlapping at the dispersive element 112, and thus that degradation in the fast-axis beam quality is minimized or substantially eliminated. As mentioned above, the resulting beam quality (e.g., along the fast axis) of the output beam 118 may be substantially equal to the beam quality of a single one of the emitters 105.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of laser emission, the method comprising:
emitting individual beams from each of a plurality of beam emitters, each beam having a first axis and a second axis;
at least partially converging the beams toward a dispersive element with a collimation lens configured to collimate the beams along the first axis;
dispersing the beams with the dispersive element; and
receiving the dispersed beams, reflecting a first portion of the dispersed beams back to the dispersive element and thence to the plurality of beam emitters to stabilize emission wavelengths thereof, and transmitting a second portion of the dispersed beams as a multi-wavelength output beam.

2. The method of claim 1, wherein the collimation lens at least partially converges the beams toward the dispersive element as a result of an orientation of an optical axis of the collimation lens.

3. The method of claim 2, wherein the optical axis of the collimation lens is not aligned with the first or second axes of the beams.

4. The method of claim 1, wherein the collimation lens causes the beams to at least partially overlap at the dispersive element.

5. The method of claim 1, wherein an orientation of an optical axis of the collimation lens is insufficient to partially overlap the beams at the dispersive element.

6. The method of claim 5, further comprising causing the converging beams to at least partially overlap at the dispersive element with one or more focusing optics.

7. The method of claim 6, wherein the focusing optics are disposed at an optical distance away from the dispersive element that is less than a focal length of the focusing optics.

8. The method of claim 6, wherein the focusing optics are disposed at an optical distance away from the beam emitters that is less than a focal length of the focusing optics.

9. The method of claim 1, further comprising rotating the beams before dispersing the beams with the dispersive element.

10. The method of claim 9, wherein the beams are rotated by approximately 90°.

11. The method of claim 9, wherein the beams are rotated by a beam rotator.

12. The method of claim 11, wherein the beam rotator is separate and discrete from the collimation lens.

13. The method of claim 11, wherein the beam rotator and the collimation lens are portions of a single optical element.

14. The method of claim 11, wherein the beam rotator comprises two spaced-apart cylindrical lenses.

15. The method of claim 11, wherein an optical axis of the beam rotator is aligned with an optical axis of the collimation lens.

16. The method of claim 11, wherein an optical axis of the beam rotator is not aligned with an optical axis of the collimation lens.

17. The method of claim 1, wherein the collimation lens comprises a fast-axis collimation lens.

18. The method of claim 1, wherein the dispersive element comprises a diffraction grating.

19. The method of claim 1, further comprising coupling the output beam into an optical fiber.

20. The method of claim 1, further comprising processing a workpiece with the output beam.

21. The method of claim 20, wherein processing the workpiece comprises at least one of welding, cutting, or drilling the workpiece.

* * * * *